(12) United States Patent
Schie

(10) Patent No.: US 8,378,658 B2
(45) Date of Patent: Feb. 19, 2013

(54) LOAD SWTCH FOR REMOVING HIGH FREQUENCY RIPPLE, NOISE AND/OR SPIKES WHILE PROVIDING POWER TO SUBSYSTEMS

(75) Inventor: David Schie, Cupertino, CA (US)

(73) Assignee: Micrel, Inc., San Jose, CA (US)

( * ) Notice: Subject to any disclaimer, the term of this patent is extended or adjusted under 35 U.S.C. 154(b) by 262 days.

(21) Appl. No.: 12/823,829

(22) Filed: Jun. 25, 2010

(65) Prior Publication Data

US 2011/0316519 A1 Dec. 29, 2011

(51) Int. Cl.
*H01F 29/14* (2006.01)
*G05F 3/02* (2006.01)

(52) U.S. Cl. .......... 323/313; 327/538; 327/542

(58) Field of Classification Search .......... 323/273–281, 323/299, 303, 312, 316; 327/557, 558, 559, 327/538, 543
See application file for complete search history.

(56) References Cited

U.S. PATENT DOCUMENTS

| | | | | |
|---|---|---|---|---|
| 5,672,959 | A * | 9/1997 | Der | 323/273 |
| 6,204,650 | B1 * | 3/2001 | Shimamori | 323/283 |
| 6,271,720 | B1 * | 8/2001 | Sevastopoulos | 327/556 |
| 7,248,103 | B2 * | 7/2007 | Marais | 327/553 |
| 7,282,895 | B2 * | 10/2007 | Thiele et al. | 323/266 |
| 7,498,778 | B2 | 3/2009 | Seiersen | |
| 7,564,249 | B2 * | 7/2009 | Bauer et al. | 324/713 |
| 7,821,240 | B2 * | 10/2010 | Oddoart et al. | 323/269 |
| 8,080,984 | B1 * | 12/2011 | Geynet | 323/280 |
| 2008/0143307 | A1 | 6/2008 | Bassett et al. | |
| 2009/0243568 | A1 * | 10/2009 | Nguyen | 323/274 |

FOREIGN PATENT DOCUMENTS

EP 0744683 A1 11/1996

OTHER PUBLICATIONS

Gerhard Thiel and Erich Bayer, Current-Mode LDO With Active Dropout OPtimization, 2005, IEEE Conference Publications, Texas Instruments Duestchland Bmbh, pp. 1203-1208.*

* cited by examiner

*Primary Examiner* — Bao Q Vu
*Assistant Examiner* — Zekre Tsehaye
(74) *Attorney, Agent, or Firm* — Weiss & Moy, P.C.; Jeffrey D. Moy

(57) ABSTRACT

A semiconductor device, circuit, and AC and DC load switch for maintaining a small input-output differential voltage and providing a defined response. The load switch can include a pass element coupled to an input terminal and an output terminal. The pass element can include a control terminal, with the control terminal controlling a response of the pass element. The load switch can include a first loop coupled to the control terminal configured to control a voltage drop between the input terminal and the output terminal while maintaining high impedance with the pass element. The load switch can include a second loop coupled to the control terminal configured to provide a defined filter response from the input terminal. The defined response can be a low pass response, high pass response, or a band pass response. The passband and/or stopband of the response can be programmed.

2 Claims, 4 Drawing Sheets

US 8,378,658 B2

LOAD SWTCH FOR REMOVING HIGH FREQUENCY RIPPLE, NOISE AND/OR SPIKES WHILE PROVIDING POWER TO SUBSYSTEMS

TECHNICAL FIELD

This application generally relates to power systems, and, more particularly, to a load switch which maintains a very small input-output differential voltage while providing filtering.

BACKGROUND

Power consumption has become a primary concern within many electronic systems, especially in portable devices running from a battery. These devices can include numerous subsystems often being connected or disconnected through switching elements to save power. Today, and in most systems, electronic devices use analog switches or low dropout regulators (LDOs). The subsystems, through these switching elements, can be connected to a DC/DC converter. Often these DC/DC converters include load lines and variable output voltages which attempt to maximize battery life.

However, by connecting the switching elements to a DC/DC converter, noise can be introduced to the load potentially interfering with downstream components, including RF components. For analog switches, many systems have utilized LC filters to attenuate this noise. If an LDO is used, instead of an analog switch, and the LDO filtering response is not sufficient, many systems also utilize passive filter components in addition to an LDO for filtering.

The use of an analog switch is non-ideal since passive filter components must be added taking up board space and raising the overall cost of the system. In addition, the use of an LDO as a filtering element, whether with or without external components, is non-ideal since LDOs generally have a constant output voltage that does not track the input. Typically, this produces a greater voltage drop and in essence, a lower efficiency than ideal until right before dropout. Furthermore, it is prohibitive to provide a multi-order wideband filter response utilizing either of the above solutions due to component proliferation and the single order response generally provided by LDOs.

SUMMARY

This summary is provided to introduce a selection of concepts in a simplified form that are further described below in the DESCRIPTION OF THE APPLICATION. This summary is not intended to identify key features of the claimed subject matter, nor is it intended to be used as an aid in determining the scope of the claimed subject matter.

In accordance with one aspect of the present application, a semiconductor device is provided. The semiconductor device can include a pass element coupled to an input terminal and an output terminal, wherein the pass element includes a control terminal, the control terminal controlling a gain response of the pass element. In addition, the semiconductor device can include a first loop coupled to the control terminal configured to control a voltage drop between the input terminal and the output terminal while maintaining high impedance with the pass element. The semiconductor device can also include a second loop coupled to the control terminal configured to provide a defined response from the input terminal.

In accordance with another aspect of the present application, a circuit having an input terminal and an output terminal is provided. The circuit can include a transistor having a gate, source, and drain, the drain of the transistor coupled to the input terminal and the source coupled to the output terminal. In addition, the circuit can include a gain element with a defined AC and DC response having an inverting input, a non-inverting input, and an output, wherein the output of the gain element is coupled to the gate of the transistor. The circuit can also include an optimized drop reference generating circuit having two replica transistors scaled in size against said transistor, wherein all three elements are connected to the gate and source and the reference voltage maintaining, through the gain element, the transistor just within saturation.

In accordance with yet another aspect of the present application, a low pass AC and DC load switch with a programmable stopband or passband receiving an input voltage and providing an output voltage is provided. The switch can include a loop response regulating the output voltage to a voltage lower than the input voltage so that saturation or high impedance operation is maintained. In addition, the switch can include a loop filter for providing a stopband or passband AC filter response, wherein the loop filter has coefficients based on the programmable stopband or passband.

BRIEF DESCRIPTION OF DRAWINGS

The novel features believed to be characteristic of the application are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The application itself, however, as well as a preferred mode of use, further objectives and advantages thereof, will be best understood by reference to the following detailed description of illustrative embodiments when read in conjunction with the accompanying drawings, wherein:

DESCRIPTION OF THE APPLICATION

Figure 1:
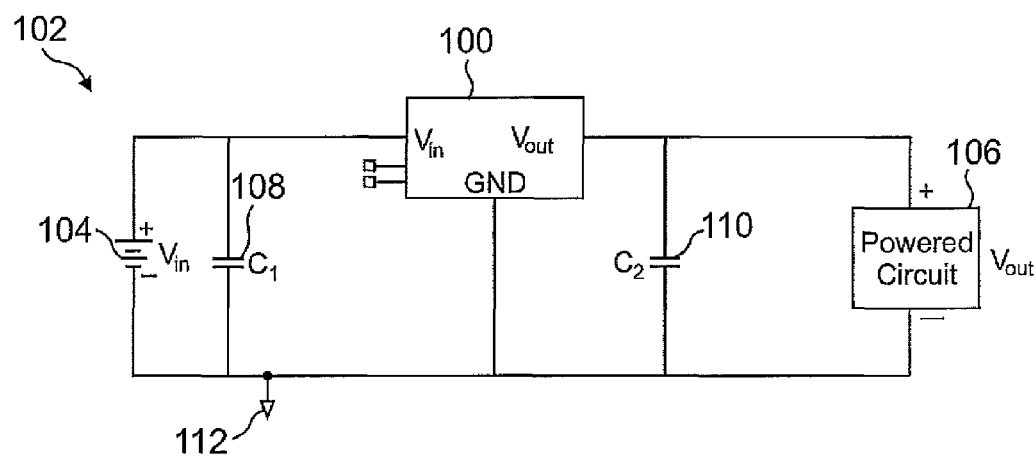
FIG. 1 depicts a typical application in which the exemplary load switch can be used in accordance with one aspect of the present application.

The description set forth below in connection with the appended drawings is intended as a description of presently preferred embodiments of the application and is not intended to represent the only forms in which the present application can be constructed and/or utilized. The description sets forth the functions and the sequence of steps for constructing and operating the application in connection with the illustrated embodiments. It is to be understood, however, that the same or equivalent functions and sequences can be accomplished by different embodiments that are also intended to be encompassed within the spirit and scope of this application.

Generally described, the present application relates to a power system, and more particularly, to a load switch having a discrete filter replacement capability that can have the added benefit of maintaining a higher order characteristic than the passives filter components being replaced. In one illustrative embodiment, the load switch can include a pass element coupled to an input terminal and an output terminal. The pass element can include a control terminal, with the control terminal controlling a gain response of the pass element. The load switch can further include a first loop coupled to the control terminal configured to control a voltage drop between the input terminal and the output terminal while maintaining high impedance with the pass element. The loop can maintain saturation when a common source MOSFET configuration is used. In addition, the load switch can include a second loop coupled to the control terminal configured to provide a defined response from the input terminal. The defined response can provide a low pass response, high pass response, or a band pass response. The passband and/or stopband of the response can be programmed.

For frequencies beyond the bandwidth of the control terminal, in one embodiment, an external capacitor can be coupled to the output terminal. The external capacitor can be selected with a resonant frequency such that the capacitor divider, formed by the parasitics across the primary pass element and the external capacitor, provides passive attenuation.

In another illustrative embodiment, the pass element can be split into two parallel elements with a lower bandwidth control loop slewing the larger device which handles the bulk of the load, and a higher frequency control loop rejecting the DC/DC noise ripple for minimizing the current drawn by a driver. In this embodiment, the pass elements can be provided in the form of parallel followers or alternatively, a large follower with a smaller inverting pass element. Typically, this smaller element can allow use of a lower voltage semiconductor device since often it does not require its control node to be driven above the input voltage as does the follower configuration.

In yet another illustrative embodiment, a saturation detection circuit can be used as part of a control loop to determine the output reference voltage required to maintain a voltage drop between the input terminal and the output terminal which maintains high impedance with the pass element. The circuit can maintain the drain to source voltage drop at a point beyond the parabolic knee of the triode to saturation $V_{ds}/I_{ds}$ characteristic to ensure high impedance or can be set just outside saturation provided the circuit boosts the gain of the loop to compensate for the loss of the gain on the parabolic knee.

Throughout the previous illustrations, a component was described above as being capable of determining the minimum drop required across a semiconductor pass element to remain saturated and thus provide high impedance. The component can also provide an output voltage reference to a control loop which would reflect the minimum input to output voltage drop required to maintain said saturation and thereby provide input voltage tracking functionality. The component can provide enabling functionality, i.e., switch capabilities, and single to multi-order filter responses. The component can further include certain digital or analog components for programming the stop or pass bands.

As will be shown, the load switch can remove high frequency ripple, noise, and spikes while providing power to subsystems. In addition, distortions often associated with switching technologies are removed or minimized. Through the design considerations provided below, power loss is minimized to maximize efficiency and extend battery life for the end user while removing bulky parts. One skilled in the relevant art will appreciate the advantages provided by the load switch is more fully described below.

While described herein as a load switch, the present application can also relate to linear regulators or voltage regulators such as a low dropout regulator (LDO). Applications for the load switch can include, but are not limited to, cell phone transceiver power, radio frequency (RF) power, and global positioning systems.

With reference now to FIG. 1, a typical application 102 for the load switch 100 is shown. In the embodiment, the load switch 100 can be coupled to a DC/DC converter power input 104. The load switch 100 generally contains a reduced footprint replacement for discrete ladder filters, which were commonly placed in previous circuits. In the application 102, the load switch 100 can receive an input voltage $V_{in}$ 104 and provide an output voltage $V_{out}$ to load 106. Capacitors, such as $C_1$ 108 and $C_2$ 110 provide high frequency current paths and can also be used to compensate said load switch 100.

In the illustrative embodiment provided above, the output voltage $V_{out}$ 106 can be provided to a powered circuit. Ground reference 112 can be coupled to the input voltage $V_{in}$ 104, the output voltage $V_{out}$ 106, the load switch 100, the powered circuit, and capacitors $C_1$ 108 and $C_2$ 110. While several components have been described in the context of this application 102, numerous other types of applications 102 can use load switch 100.

While one application 102 was disclosed above, one skilled in the relevant art will appreciate that many applications can use the load switch 100 described herein. Furthermore, those design characteristics provided above are intended to provide one example of a load switch 100 and does not limit the present application to the circuit described herein.

Figure 2:
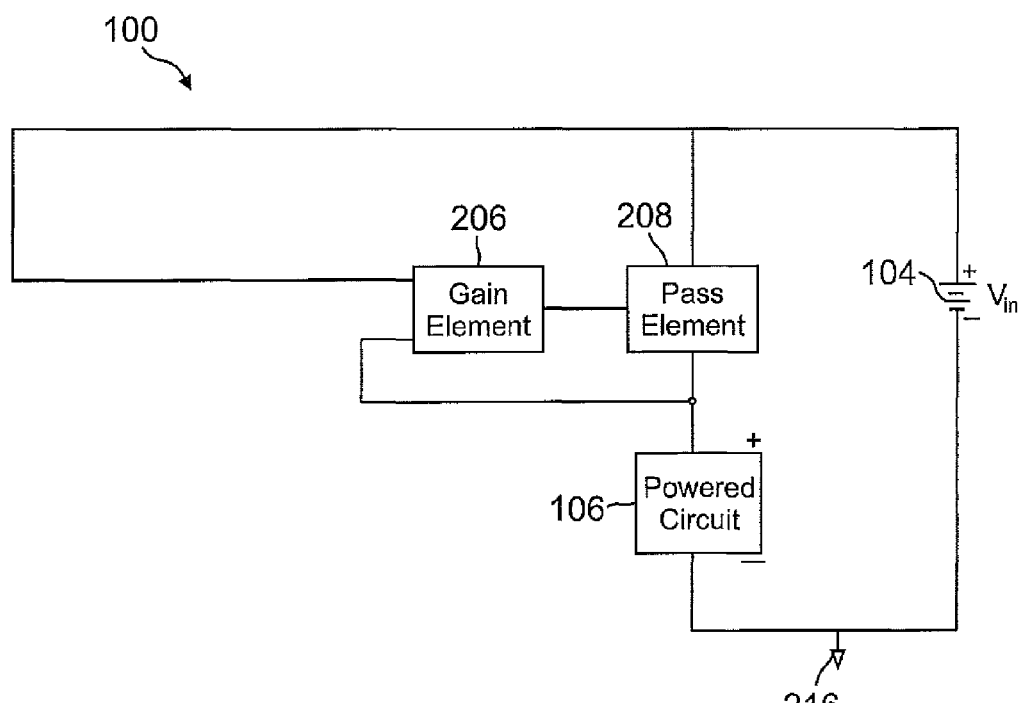
FIG. 2 provides an exemplary circuit illustrating components within the load switch in accordance with one aspect of the present application.

FIG. 2 provides an exemplary circuit illustrating components within a typical load switch 100 in accordance with one aspect of the present invention. The switch 100 can maintain a very small input voltage $V_{in}$ 104 to output voltage $V_{out}$ 106 differential while providing a filter response. The main components of the exemplary load switch 100 are, but not limited to, a gain element with AC and DC response 206, a reference voltage connected to the non-inverting terminal of said AC and DC gain element 206 and a pass element 208. Each of these components will be described in further detail below. Following, operations of those components will thereafter be described.

Because load switches 100 alone do not provide filtering capabilities, previous load switches 100 were combined with passive ladder filter networks. Nonetheless, these passive ladder filters took up additional space and were not cost efficient. The AC and DC gain element 206 can attenuate ripple and noise from the input 104. As will be shown, the AC and DC gain element 206 can provide a fixed response or can be programmed. Generally, the AC and DC gain element 206 can include a digital filter or an analog filter. One type of digital filter is an infinite impulse response (IIR) filter and another is a finite impulse response (FIR) filter. Known to those skilled in the relevant art, numerous types of filters exist for processing signals and are incorporated herein.

Previously described, examples of the AC and DC gain element 206 were provided. As will become apparent, the AC and DC gain element 206 can come in many forms and is not intended to be limited to those described above. The AC and DC gain element 206, itself, can provide a low-pass response, high-pass response, or a bandpass response. Low-pass responses can pass low frequency signals but attenuate signals with frequencies higher than a cutoff frequency. High-pass responses can pass high frequencies but attenuate frequencies lower than a cutoff frequency. A bandpass response can pass frequencies within a certain range and reject frequencies outside that range.

In accordance with the present application, the passband and stopband can be programmed. In one embodiment, the stopband or passband edge frequency of the loop transfer function can be programmed in conformance with the magnitude of a resistor or capacitor connected to the programming terminal of the filter. In another embodiment, the stopband or passband edge frequency of the loop transfer function can be programmed in conformance with the magnitude of a binary register. The binary register can be programmed by a digital interface. The coefficients can be selected from a minimum order filter transfer function and a maximally flat or equiripple requirement in the stopband and passband.

Typically, the AC and DC gain element 206 can be coupled to a controller. The controller can calculate loop filter coefficients based on stopband and passband selections. The controller can also select the minimum order filter transfer function based on the selections in addition to maximally flat or equiripple requirements in the passband and stopband either directly or through the use of lookup tables.

Coupled to the AC and DC gain element 206, and in particular the output of the AC gain element 206, can be a pass element or transistor 208 as shown in FIG. 2. In one embodiment, the transistor 208 can be an n-channel MOSFET having a common source configuration. The transistor 208 can include a gate, source, and drain. The gate of the MOSFET can be the control terminal. The MOSFET's drain can be coupled to the input voltage $V_{in}$ 104 and the MOSFET's source can be coupled to the output voltage $V_{out}$ 106. While the MOSFET can provide numerous features and functionalities, the MOSFET's gate can be modulated so as to maintain $V_{ds} > V_{gs} - V_t$, whereby $V_{ds}$ represents the voltage between the drain and source of the MOSFET, $V_{gs}$ represents the voltage between the gate and source of the MOSFET, and $V_t$ represents a threshold value. In one embodiment, a saturation detector circuit can be utilized to ensure that the MOSFET maintains operation in the saturation region.

While typical components within the load switch 100 were provided, one skilled in the relevant art will appreciate that there can be fewer or more components within the switch 100. Furthermore, the input voltage $V_{in}$ 104 can include AC components.

As previously described, the load switch 100 can maintain a constant voltage between the input voltage $V_{in}$ 104 and the output voltage $V_{out}$ 106. This can rely upon a reference voltage provided at the noninverting input of the AC gain element 206, and an output voltage or scaled $V_{out}$ 106 fed into the inverting input of the AC and DC gain element 206 in negative feedback configuration. The gain element 206 can control the voltage drop of the transistor 208 to maintain the output voltage $V_{out}$ 106 at the desired reference voltage. The feedback provided to the AC and DC gain element 206 can monitor the output voltage $V_{out}$ 106 which is in turn coupled to the load which can be a high impedance, resistive or other type of load.

Through the AC and DC gain element 206, multiple operations for the load switch 100 to maintain a very small input voltage $V_{in}$ 104 and output voltage $V_{out}$ 106 differential while providing a programmable stopband and passband are provided. The AC gain element 206 can act as an error amplifier. As shown, the output can be fed into the gate of a transistor 208 which modulates the transistor 208.

Figure 3:
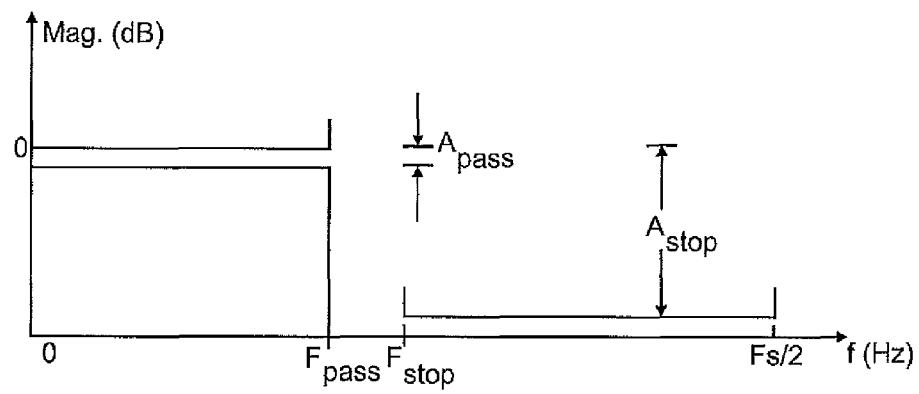
FIG. 3 shows an illustrative bode plot for a filtered response "mask" and the transfer characteristics of the filter in accordance with one aspect of the present application.
Figure 4:
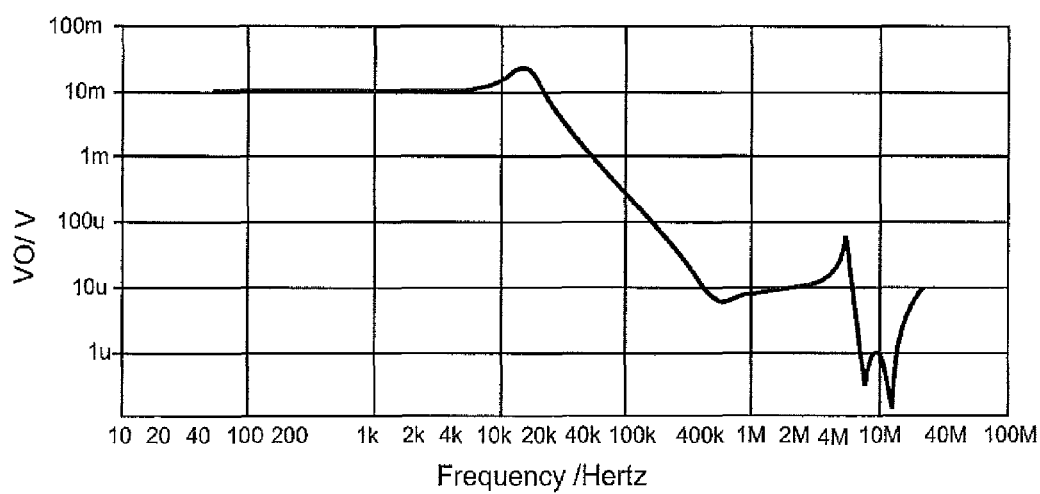
FIG. 4 illustrates an LC filter response common to existing discrete components added to a load switch in accordance with one aspect of the present application.

FIG. 3 shows an illustrative bode plot for a filtered response "mask" and the transfer characteristics of the load switch 100 in accordance with one aspect of the present application. As depicted in FIG. 4, an LC filter response common to existing discrete components added to a load switch 100 is shown.

Figure 5:
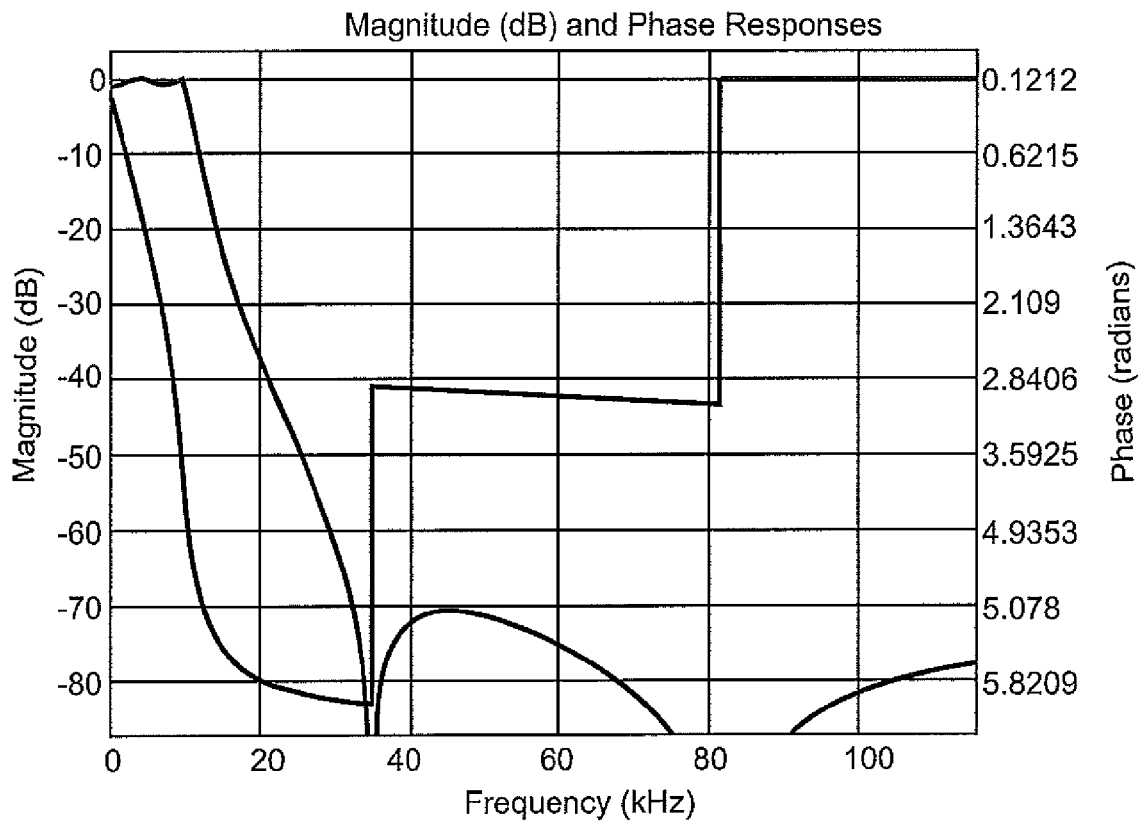
FIG. 5 is a graph providing magnitudes and phase responses for the exemplary load switch in accordance with one aspect of the present application.

Furthermore, and as shown in FIG. 5, a graph providing magnitudes and phase responses for the exemplary load switch 100 is presented.

Figure 6:
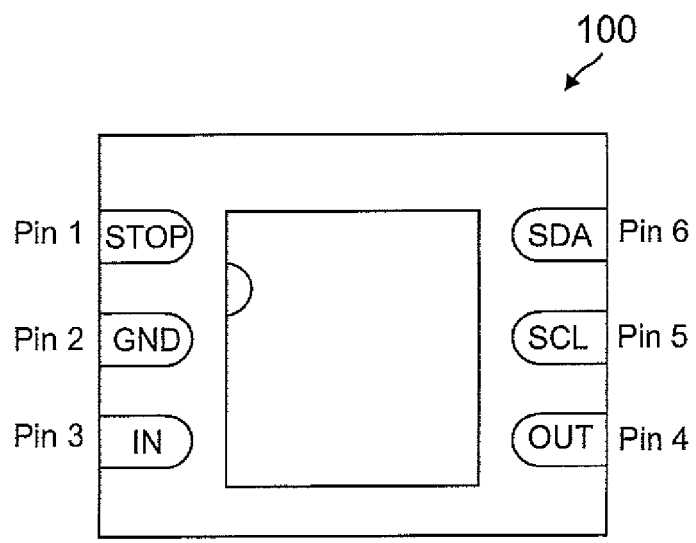
FIG. 6 is a diagram showing a typical pin configuration for the exemplary load switch in accordance with one aspect of the present application.

With reference now to FIG. 6, a typical pin configuration for the exemplary load switch 100 is shown. Relatively speaking, the number of pins on load switch 100, within this embodiment, is small making it an ideal fit for many applications today. Pin 1 represents STOP, PIN 2 represents GND, PIN 3 represents IN, PIN4 represents OUT, PIN5 represents SCL, and PIN 6 represents SDA, which are the terminals for a two wire digital bus for programming the passband and stop band. A minimal exemplary load switch 100 may include only Pin 2, Pin 3 and Pin 4.

Figure 7:
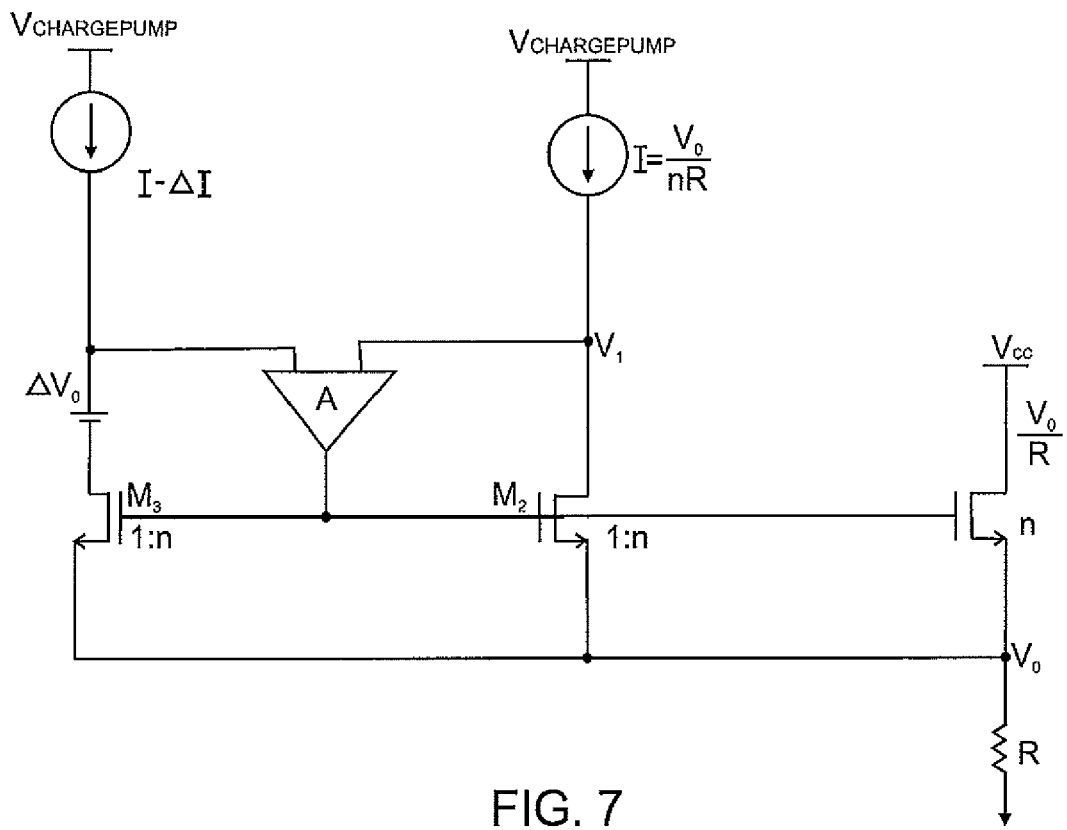
FIG. 7 depicts an illustrative saturation estimator circuit for maintaining the drain to source voltage drop in accordance with one aspect of the present application.

As shown in FIG. 7, a saturation measuring circuit can be used to determine the output voltage reference that the AC gain element 206 uses to work across its drain to source terminals. This circuit can be used to ensure that the pass element 208 remains saturated by determining the minimum drop needed to maintain saturation. The drop can then be used as the reference output voltage to track the minimum drop. The replica pass element and saturation estimator circuit can be used to establish an output terminal reference voltage. The reference voltage can be established through the control loop, which can maintain the drain to source voltage drop at a point just within saturation for the required load current.

Figure 8:
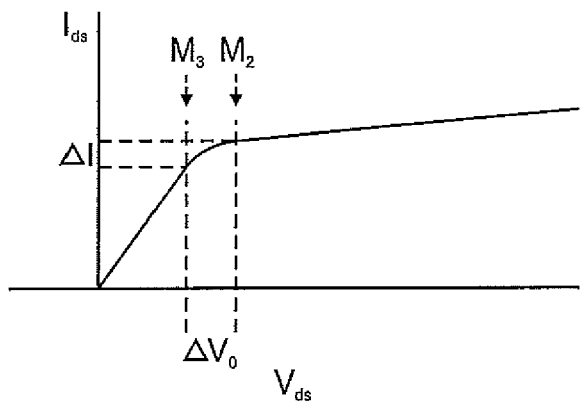
FIG. 8 shows a $V_{ds}/I_{ds}$ characteristic of the illustrative saturation estimator circuit in accordance with one aspect of the present application

By way of example, but not limitation, the saturation measuring circuit can include two replica transistors $M_3$ and $M_2$ scaled with the primary pass element 208, wherein all three element sources are connected to the same potential $V_o$. The drains of the replica transistors $M_3$ and $M_2$ can be connected to a voltage $V_{CHARGEPUMP}$ that is higher than the pass element 206 drain input voltage $V_{CC}$. The current mirrors are driven by a first replica device $M_2$ at the current of $I=V_o/nR$ and a second replica device $M_3$ at a slightly lower current of $I-\Delta I$ wherein the n of $I=V_o/nR$ is a scaling factor between the primary pass element and the replica devices. For replica transistor $M_3$, the small voltage $\Delta V_o$, corresponding to the change in $V_{ds}$ from I to I-$\Delta I$ as shown in FIG. 8, is inserted in series with the I-$\Delta I$ current source and $M_3$. An amplifier A, with terminals connected to the positive side of the $\Delta V_o$ voltage drop element and the drain of $M_2$, then forces operation similar to that shown in FIG. 8 for a given $V_o$ where $M_2$ is just within saturation and $M_2$ and $M_3$ straddle the parabolic knee between triode and saturation or alternatively $M_3$ operates on the parabolic knee. A third loop, for example an iterative loop, can then increment $V_o$, and in turn the current sources connected to $V_{CHARGEPUMP}$ until either amplifier A loses lock of a suitable operating point or $V_I$ reaches $V_{CC}$. If either of these conditions is met, the loop can decrement $V_o$ to the last known point offering either lock or $V_I$ operation before reaching $V_{CC}$.

FIG. 8 shows a $V_{ds}/I_{ds}$ characteristic of the illustrative saturation estimator circuit in accordance with one aspect of the present application. In addition to operation as shown, the saturation measuring circuit can maintain the drain to source voltage drop of the pass element 206 at a point on the parabolic knee of the triode to saturation $V_{ds}/I_{ds}$ characteristic where the output impedance is lower than saturation but higher than triode. The loss of overall gain resulting from operating on the knee can be determined by the saturation estimator circuit which in turns raises the control loop gain, for example by increasing an amplifier tail current, to compensate for the loss of overall loop gain. As provided, the curve shows the constant $V_{gs}$ characteristic transition from triode to saturation as $V_{ds}$ is increased. The triode characteristic can include a low resistance characteristic followed by a parabolic characteristic between $M_3$ and $M_2$. A flat portion on the right side of the curve represents the saturation.

In operation, when the same gate to source voltage is applied to two MOSFETS that are identical and one MOS- FET is operated with a drain to source voltage of $M_2$ and the second MOSFET is operated with a drain to source voltage of $M_3$, the difference in current between the MOSFETS can be $\Delta I$, as indicated on the left side of FIG. 8. If $M_3$ operated where $M_2$ is currently and $M_2$ was further up the curve, there typically would not be as much drop in $\Delta I$. The circuit provided in FIG. 7 forces the currents in the two devices $M_3$ and $M_2$ to correspond to a predetermined difference which corresponds per the curve to a $V_{ds}$ voltage difference $\Delta V_o$ such that the two replica devices have $M_2$ on the curve and $M_3$ on the curve as shown in FIG. 8.

The $V_{ds}$ of $M_3$ when adding $\Delta V_o$ is typically the same as the $V_{ds}$ of $M_2$. Circuit A, which can take the form of an op amp, holds the $V_{ds}$ of $M_3$ plus $\Delta V_o$ and the $V_{ds}$ of $M_2$ at the same voltage. The saturation estimator circuit can be an iterative loop that increments $V_o$ and in turn the current mirrors. With each increment the described loop can lock around the new "knee". Eventually an output voltage reference voltage can be determined which allows for operation just within saturation which represents a minimized drop while retaining high impedance operation of the MOSFET 206 required for high loop gain.

The two replica devices $M_3$ and $M_2$ can be scaled such that they are much smaller than and utilize much less current than the primary pass element 208. In the shown embodiment of FIG. 7, the replica devices $M_3$ and $M_2$ are n times smaller than the main pass element. Additionally, $M_3$ and $M_2$ may be further scaled according to lambda such that in saturation a pair of detectors with a small window can easily determine if they have risen into the saturation region or are in the triode region. In this case the replica devices $M_3$ and $M_2$ take into account finite output impedance, such as current difference for $V_{ds}$, in saturation.

The circuit in FIG. 7 can produce an optimized drop across the primary pass element 206 which ensures the primary pass element is in saturation or near saturation. While one saturation detector was shown, the present application is not limited to such. Those skilled in the relevant art will appreciate that there can be numerous types of other saturation detectors and the present application is not limited to the single embodiment described above.

One of the primary limitations encountered from an implementation described above is the difficulty of creating a driver circuit capable of slewing a capacitive semiconductor control element at high frequencies as the device capacitance is generally large for devices able to handle reasonable load currents. In addition, follower configurations can require operations above the input voltage forcing use of a higher voltage process than the minimum input voltage and demand either a bias input or a charge pump.

To minimize the current drawn by the driver, the pass element 208 can be split into two parallel elements with a lower bandwidth control loop slewing the larger device which handles the bulk of the load, and a higher frequency control loop rejecting the DC/DC noise ripple. The pass elements can be parallel followers or alternatively a large follower with a smaller inverting pass element. Typically, this can allow the use of a lower voltage device since it does not require its control node to be driven above the input voltage as does the follower configuration. The first pass element can provide a slow loop and slower driver for driving the DC component. The secondary pass element can be smaller and is coupled to a higher bandwidth control loop. The smaller pass element can allow the handling of the higher frequency response and the larger pass element the lower frequency response.

The foregoing description is provided to enable any person skilled in the relevant art to practice the various embodiments described herein. Various modifications to these embodiments will be readily apparent to those skilled in the relevant art, and generic principles defined herein can be applied to other embodiments. Thus, the claims are not intended to be limited to the embodiments shown and described herein, but are to be accorded the full scope consistent with the language of the claims, wherein reference to an element in the singular is not intended to mean "one and only one" unless specifically stated, but rather "one or more." All structural and functional equivalents to the elements of the various embodiments described throughout this disclosure that are known or later come to be known to those of ordinary skill in the relevant art are expressly incorporated herein by reference and intended to be encompassed by the claims. Moreover, nothing disclosed herein is intended to be dedicated to the public regardless of whether such disclosure is explicitly recited in the claims.

What is claimed is:

1. A circuit having an input terminal and an output terminal comprising:
   a transistor having a gate, source, and drain, said drain of said transistor coupled to said input terminal and said source coupled to said output terminal;
   a gain element with a defined AC and DC response having an inverting input, a non-inverting input, and an output, wherein said output of said gain element is coupled to said gate of said transistor; and
   an optimized drop reference generating circuit having two replica transistors scaled in size against said transistor, wherein all three elements are connected to said gate and source, said reference generating circuit maintaining said pass element just within saturation;
   wherein drains of said replica transistors are connected to two separate current mirrors tied to a voltage higher than an input voltage of said pass element's drain, wherein said current mirrors are established inversely to a load and in conformance with a current/voltage drop characteristic coincident with operation in saturation at said load for a first replica device and in triode or on a parabolic knee for a second replica device, wherein a loop adjusts output voltage at said transistors sources until a drop across said pass element is optimized, said optimized drop recognized as a point just before an operating point of said two replica devices that can no longer be maintained or a voltage on a drain of said first replica device reaches said input voltage.

2. The circuit of claim 1, wherein said voltage higher than said input voltage of said pass elements drain is developed using a charge pump circuit.

* * * * *

UNITED STATES PATENT AND TRADEMARK OFFICE
CERTIFICATE OF CORRECTION

PATENT NO. : 8,378,658 B2
APPLICATION NO. : 12/823829
DATED : February 19, 2013
INVENTOR(S) : David Schie It is certified that error appears in the above-identified patent and that said Letters Patent is hereby corrected as shown below:

Title page, Item [54] and in the Specification, Column 1, the title should be:

LOAD SWITCH FOR REMOVING HIGH FREQUENCY RIPPLE, NOISE AND/OR SPIKES WHILE PROVIDING POWER TO SUBSYSTEMS.

Signed and Sealed this
Twenty-first Day of May, 2013

Teresa Stanek Rea
*Acting Director of the United States Patent and Trademark Office*